United States Patent
Lazarovich et al.

(10) Patent No.: US 7,986,500 B2
(45) Date of Patent: Jul. 26, 2011

(54) GROUND FAULT DETECTION IN AN UNGROUNDED ELECTRICAL SYSTEM

(75) Inventors: David Lazarovich, Thornhill (CA); Srinivasa Rao Dangeti, Razole (IN); Subodh Keshri, Mississauga (CA); Ileana Rusan, Toronto (CA); Sanjay Kumar Chaudhary, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 595 days.

(21) Appl. No.: 12/104,273

(22) Filed: Apr. 16, 2008

(65) Prior Publication Data

US 2009/0147414 A1 Jun. 11, 2009

Related U.S. Application Data

(60) Provisional application No. 60/992,752, filed on Dec. 6, 2007.

(51) Int. Cl.
*H02H 3/00* (2006.01)
*H02H 9/08* (2006.01)

(52) U.S. Cl. ............. 361/42; 361/49; 340/649; 340/650

(58) Field of Classification Search .................... 361/49, 361/42; 340/649, 650
See application file for complete search history.

(56) References Cited

U.S. PATENT DOCUMENTS

| | | | | |
|---|---|---|---|---|
| 2,342,800 | A | * | 2/1944 | Griscom .......................... 361/47 |
| 3,496,414 | A | | 2/1970 | Logston |
| 4,580,186 | A | * | 4/1986 | Parker et al. ..................... 361/42 |
| 4,882,522 | A | * | 11/1989 | Brown .......................... 315/119 |
| 4,929,901 | A | | 5/1990 | Kimball et al. |
| 5,508,620 | A | * | 4/1996 | Pfiffner ......................... 324/545 |
| 5,629,825 | A | | 5/1997 | Wallis et al. |
| 5,691,643 | A | * | 11/1997 | Ishiguro et al. ............... 324/510 |
| 5,867,358 | A | * | 2/1999 | Campbell ........................ 361/47 |
| 6,504,691 | B1 | * | 1/2003 | Matsui et al. ................... 361/38 |
| 6,888,708 | B2 | * | 5/2005 | Brungs et al. .................. 361/42 |
| 7,050,279 | B2 | * | 5/2006 | Nojima ............................ 361/42 |

FOREIGN PATENT DOCUMENTS

| | | | |
|---|---|---|---|
| JP | 2004-239863 | * | 8/2004 |
| WO | WO 2005119871 | | 12/2005 |

* cited by examiner

*Primary Examiner* — Stephen W Jackson
*Assistant Examiner* — Zeev Kitov
(74) *Attorney, Agent, or Firm* — Miriam Jackson, Esq.

(57) ABSTRACT

An ungrounded electrical power distribution system may experience a single line to ground fault. Such a fault may not disrupt operation of the system, but its presence may raise a risk of additional problems if left uncorrected. A system for progressively grounding the ungrounded system may be initiated when a line to ground fault is suspected. As grounding through successively lower impedance proceeds, fault current may increase and detection of severity of the line to ground fault may be more readily achieved, thus facilitating localization of the fault.

14 Claims, 3 Drawing Sheets

GROUND FAULT DETECTION IN AN UNGROUNDED ELECTRICAL SYSTEM

CROSS REFERENCE TO RELATED APPLICATIONS

The present application claims benefit of U.S. Provisional Application 60/992,752 filed Dec. 6, 2007.

BACKGROUND OF THE INVENTION

The present invention generally relates to apparatus and methods for providing protection for an electrical system and, more particularly, to apparatus and methods of ground fault detection in an ungrounded electrical system.

In a grounded three phase alternating current (AC) electric power system, a neutral point may be connected to ground (or chassis ground). In a grounded direct current (DC) power system, either a positive or a return conductor may be grounded. In some cases, a middle point of a DC voltage source may be grounded.

A grounded system may be grounded solidly or through some impedance. Grounding through an impedance may help in controlling a level of fault current arising out of a single line-ground fault. An ungrounded system does not have any direct connection to the ground. In other words, the grounding impedance tends to infinity.

A disadvantage of a grounded system lies in the fact that even a single line-ground fault may lead to heavy fault currents and hence disrupt operation of an entire power system. The fault has to be cleared before the grounded system resumes its normal operation. Ground faults can lead to process disruption and safety hazards such as equipment malfunctions, fire and electric shock. During a ground fault condition, power supply has to be interrupted to limit the damage to equipment.

In an ungrounded electrical power system, there may be no intentional connection between the conductors and the ground. However, in any system, stray capacitive coupling may exist between the system conductors and adjacent grounded surfaces. Consequently, an "ungrounded system" is, as a practical matter, a "capacitive grounded system" by virtue of the distributed stray capacitance.

The advantage of ungrounded system is that a single line to ground fault may have minimal fault current and hence practically no impact on the system operation. However in the event of a line-ground fault in an ungrounded system, the voltage of the healthy phases may rise to line-to-line voltage. Thus voltage stress on the healthy phase conductors may increase during fault condition. Further, there may be capacitive voltage build up if the fault is of restriking nature. Thus the phase conductors have to be insulated by design for higher voltage stress in an ungrounded system.

Though a single line to ground fault may not impact operation of an ungrounded system, a second ground fault may lead to phase-to-phase fault, with very high fault current. In the event of such a phase-to-phase fault, power interruption is required, thus leading to system outage. It is, therefore, desirable to detect and isolate and clear the first line-ground fault as soon as possible, even though it does not affect the system operation.

A single line-ground fault in an ungrounded system may produce very small current flowing through any shunt-connected or parasitic and stray capacitances. Therefore the fault detection and in particular localization is a daunting task in a large and complex ungrounded electrical distribution network which may include multiple power sources and utilization systems. Several methods have been proposed in the prior art for single line-to-ground fault detection in ungrounded or floating networks. Most of the ground fault detection methods described in the prior art rely on measurement of positive and negative line voltage with respect to a common chassis or ground potential. During single line-to-ground condition, the faulty terminal voltage may assume ground potential while the 'healthy' phase potential may rise to the original line-to-line voltage level. Single line-to-ground fault is declared when the difference between measured voltage at the positive and the negative line with respect to common chassis exceeds a threshold value. However, these methods fail to indicate the localization of the ground fault. Since is not desirable to shutdown the entire network in the event of a single ground fault, it would be a great advantage to confirm the occurrence of the fault, localize the fault and isolate only the faulty section of the network while keeping the unaffected network functions operative.

As can be seen, there is a need for a system that may provide for early detection and confirmation of occurrence of single line-ground fault in an ungrounded power distribution system. Furthermore, there is a need for such a system which may provide for detection without interruption of operation of the system.

SUMMARY OF THE PRESENT INVENTION

In one aspect of the present invention an ungrounded electrical power distribution system comprises a switching system for selectively grounding the electrical distribution system in the event of a line to ground fault.

In a further aspect of the invention a ground fault detection system for an ungrounded power system comprises a plurality of conduction paths between the power distribution system and ground potential. The conduction paths have differing impedances. A switching system progressively connects the power distribution to ground potential through successive ones of conduction paths having successively lower impedance.

In another aspect of the invention a method of distributing electrical power on an ungrounded distribution system comprises the steps of detecting a variation in line voltage to ground, connecting a high impedance conduction path between the distribution system and ground and declaring presence of line to ground fault in presence of a current change produced by connecting of conduction path.

These and other features, aspects and advantages of the present invention will become better understood with reference to the following drawings, descriptions and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention provides a system for detection of ground faults in an ungrounded electrical power distribution system or network. The inventive system may gradually ground an ungrounded system in a controlled manner for early detection and isolation of a single line-ground fault. The invention may be useful in any ungrounded commercial power system and more particularly in aerospace electrical power system application.

In contrast to the prior art, which may use line voltage variations to detect general presence of a ground fault in a system, the present invention may preclude unnecessary disconnection of power sources or loads and the resultant disruption of system operation. In the event of detection of a line-ground fault, a circuit path to ground may be produced through a collection of sequentially switched resistors. Ground fault current may then increase and localization of the ground fault may be more readily achieved.

Figure 1:
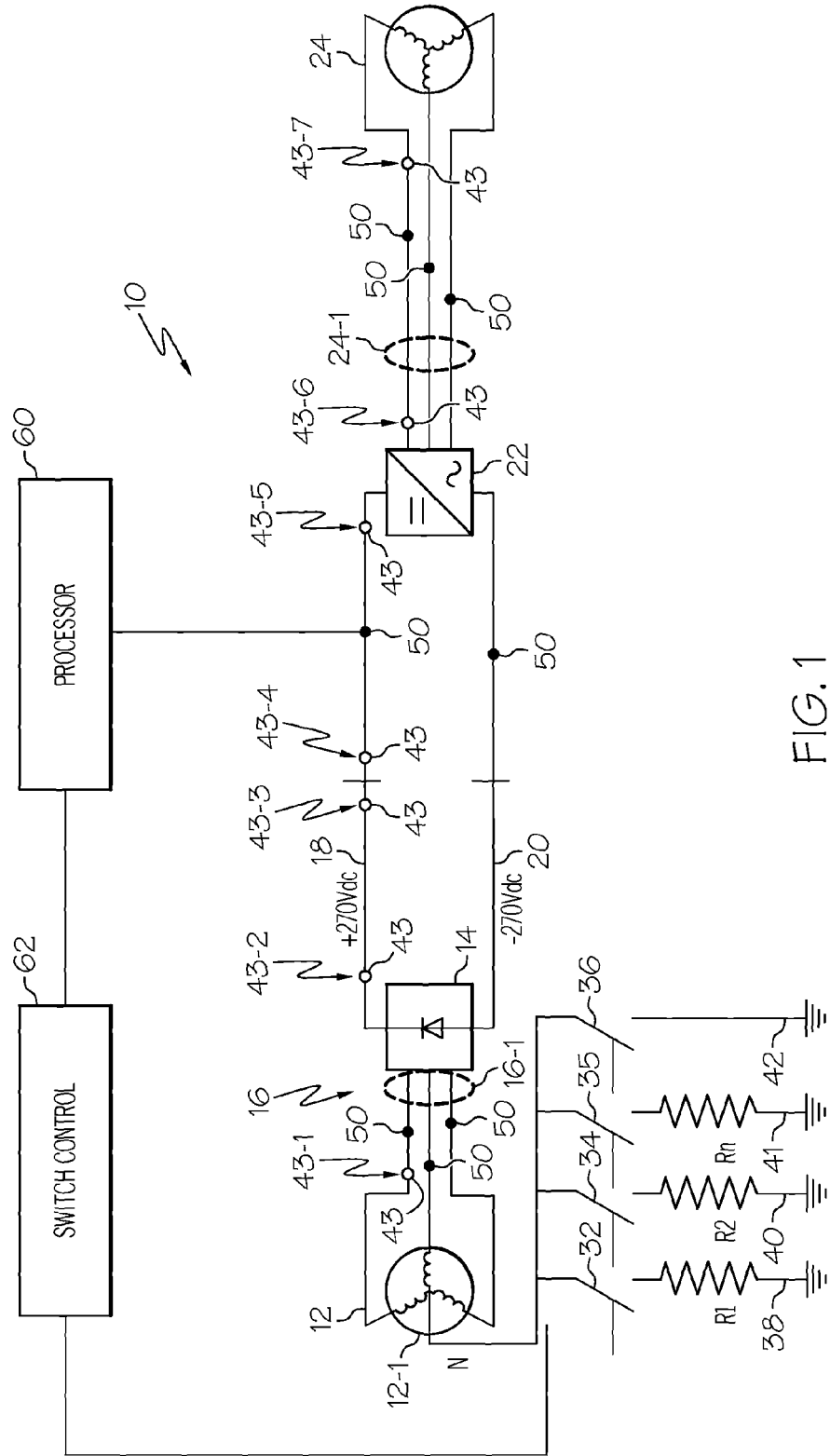
FIG. 1 is a block diagram of an ungrounded power distribution system in accordance with the invention.

Referring now to FIG. 1 there is shown a simplified form of a typical commercial or aerospace ungrounded power system 10. The power system 10 may comprise a three-phase synchronous generator 12 connected to a rectifier 14. The generator 12 and the rectifier 14 may be collectively referred to as a DC generator 16. Power distribution may take place through DC feeders 18 and 20. Power transmission in the system 10 may be considered to a two-wire DC floating power transmission. At suitable points, inverters may used to convert the DC electric power from the feeders 18 and 20 into AC power of desired voltage and frequency. In an illustrative embodiment of FIG. 1, one inverter 22 may be connected to the feeders 18 and 20. It should be understood that the system 10 may comprise more than one of the inverters 22 and more than one of the DC generators 16. A three-phase AC load 24 may be connected to the inverter 22 through phase conductors 24-1.

A neutral point 12-1 of the generator 12 may be connectable to ground through controlled switches 32, 34 and 36 and ground conduction paths 38, 40 and 42. While the system 10 may operate normally as an ungrounded system, controlled switches 32, 34 and 40 may be used to progressively ground the system 10 when and if a single line-ground fault may develop. As grounding impedance decreases, fault current may increase correspondingly and the fault may thus be more readily isolated.

In an illustrative embodiment of FIG. 1, three conduction paths 38, 40 and 42 are shown. Conduction paths 38 and 40 may comprise resistors R1 and R2 respectively. Conduction path 42 may comprise a solid grounding connection, i.e. a grounding path with zero impedance. Thus the embodiment of FIG. 1 may be considered to have three stages of progressive grounding. However, depending upon system requirements, "n" stages of resistors may be used to give a smooth transition from ungrounded to grounded system. Also, pulse width modulation (PWM) switching of resistors may be employed to provide progressive resistance variation that is smooth.

It may be noted that a single line-ground fault in an ungrounded AC system may produce very small current flowing through shunt-connected or any parasitic and stray capacitances. In an ungrounded DC system, the fault current may be characterized by transient charging/discharging current of shunt capacitance. However, in either system the faulted phase may come to ground potential, while voltages in non-faulted phases may rise to line-voltage levels.

As shown in FIG. 1, three-phase currents and voltages (with respect to ground) may be measured with sensors 43 at testing points 43-1, 43-6 and 43-7 in the AC phase conductors 16-1 of the DC generator 16 and the phase conductors 24-1 which may be connected to the three phase load 24. In the DC feeders 18 and 20, line voltages (with respect to the ground) and currents may measured at testing points 43-2, 43-3, 43-4 and 43-5. Data from the sensors 43 may be transmitted continually to a processor 60. It may be noted that, for purposes of simplicity, FIG. 1 shows the processor 60 being connected to only one of the sensors 43. In an actual embodiment of the invention, all of the sensors 43 may be connected with the processor 60

The resistances R1 and R2 may be selected so as to limit fault current through the neutral point 12-1 to specified values. A sufficiently high value may be chosen for R1, such that the fault current through the neutral point 12-1 may be limited to a maximum specified limit.

If a fault were to develop at a location far from the DC generator 16 or through some high impedance, a high value of R1 may restrict the fault current through the neutral point 12-1 to an insignificant level. In such cases, this fault current may be increased by closing the switch 34, which may connect the neutral point 12-1 to ground through a lower resistance R2.

The resistances R1 and R2 may be selected such that ground fault detectors, e.g., differential current sensors 50 around the fault may provide current differential signal to the processor 60. The values of R1 and R2 may be selected to suit any particular configuration of the system 10. In general, R2 may be about one-tenth of R1. It may be noted that, for purposes of simplicity, FIG. 1 shows the processor 60 being connected to only one of the differential current sensors 50. In an actual embodiment of the invention, all of the differential current sensors 50 may be connected with the processor 60.

Once a line-ground fault is suspected by observing some line potential coming close to ground potential or abnormal voltages at any one or more of the test points, switch 32 may be closed e.g., through activation of a switching system or switch controller 62 that may be responsive to the processor 60. The neutral point 12-1 of the generator 12 may be thus grounded through a high resistance, R1. The resistance, R1 may be selected such that in a worst case fault situation, the resultant fault current through the resistor R1 is no higher than about one (1) ampere (A) to about five (5) A.

If the resultant fault current is found to be very small and fault detection appears to be difficult, then the second switch 34 may be closed. This may connect the neutral point 12-1 with ground through the resistance R2. The switch 32 may be left closed or it may be opened before closing the switch 34. If there is no rise in neutral current, even after closing the switches 32 and 34, the switch 36 may be closed. This may directly ground the generator neutral point 12-1.

If current at the neutral point 12-1 were to remain unchanged or non-significant after high-impedance grounding, then the system 10 could be declared free from faults. When the system 10 becomes grounded and an appreciable amount of fault current flows in the system 10, the current sensors 50 may pick up the fault current. Data from the current sensors 50 may be processed in the processor 60 to localize the fault. When the system 10 is provided with the subject progressive grounding arrangement, an operator of the system may have an option to assess the severity of a fault without disrupting operation of the system operation.

Figure 2:
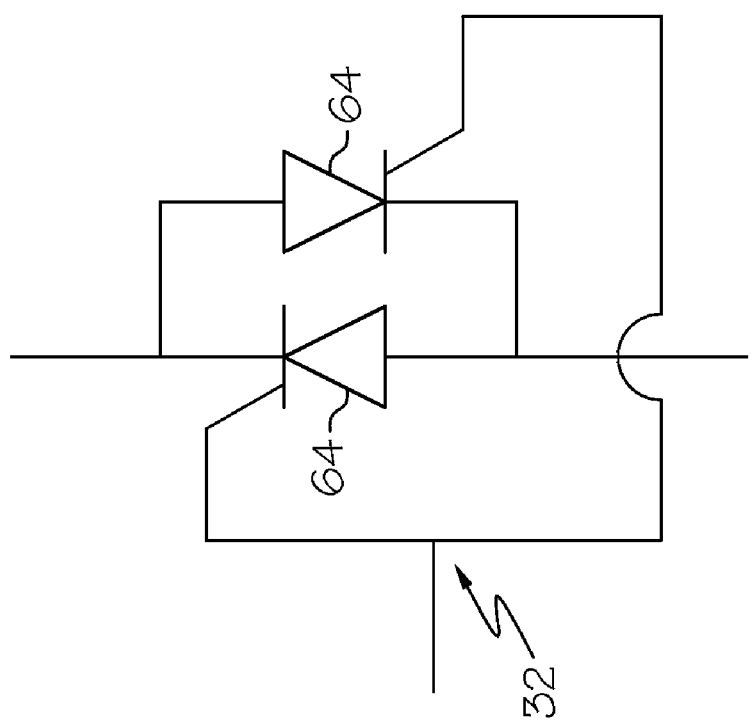
FIG. 2 is a switching arrangement that may be employed in the power distribution system of FIG. 1 in accordance with the invention.

The illustrative embodiment of the system 10 is described as one that employs switched resistance grounding. In this illustrative embodiment the grounding resistors R1, R2 . . . Rn may be changed in fixed steps as switches are closed and/or opened. As described above, PWM controlled switching of the resistors R1, R2 . . . Rn may be employed so that resistance variation is continuous and smooth. In other words, the switching controller 62 may be a PWM based controller. PWM control of switching may be readily implemented with switches such as metal oxide field effect transistors (MOSFET's) or insulated gate bipolar transistors (IGBT's) or as a pair of back-back connected thyristors 64 in one of the switches such as the switch 32 as shown in FIG. 2.

Figure 3:
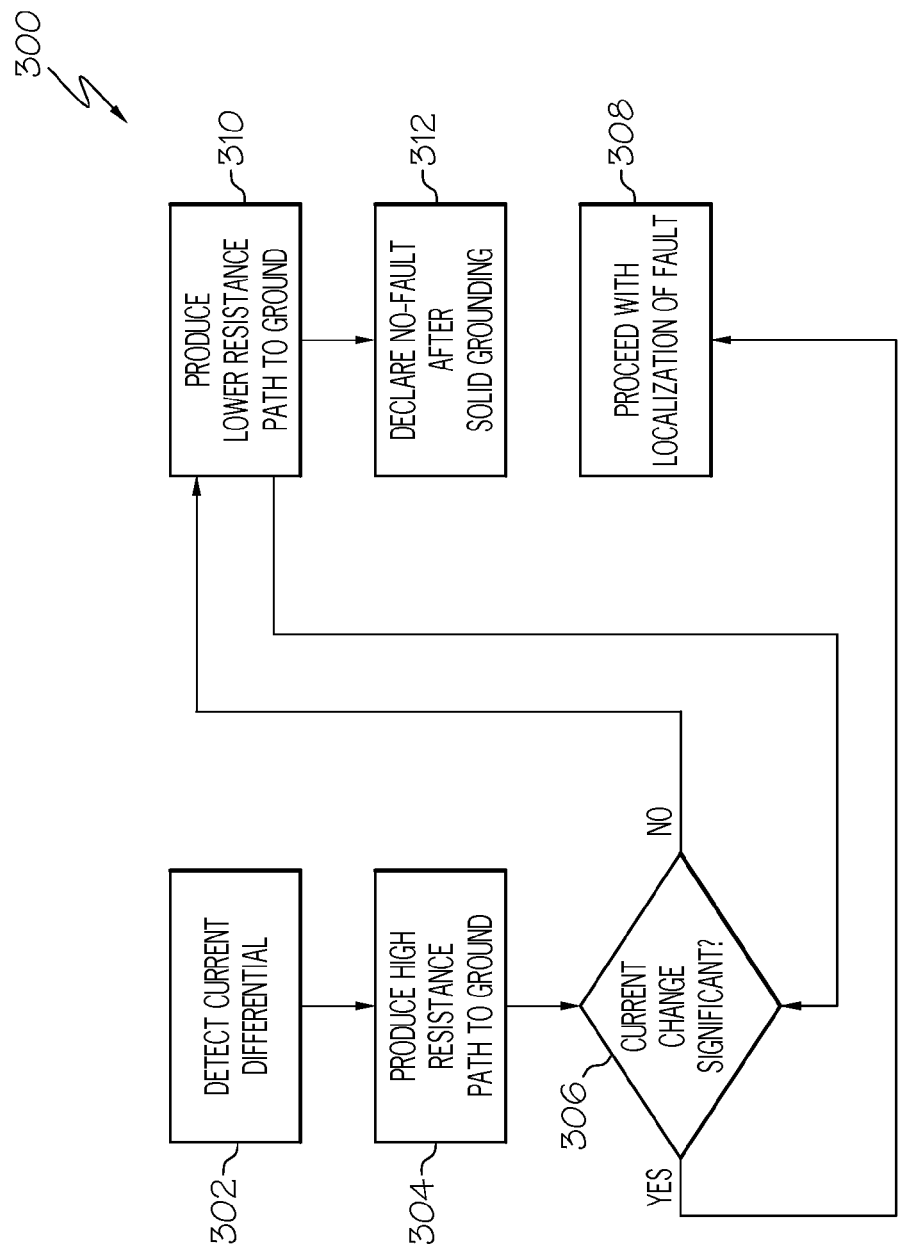
FIG. 3 is a flow chart of a method for distributing power in accordance with the invention.

Referring now to FIG. 3, which is a flow chart, it may be seen that the present invention also envisions a method 300 of detecting a single line-ground fault in an ungrounded electrical distribution system. In a step 302, current differential may be detected (e.g., one of the sensors 43 may provide a potential fault signal to the processor 60). In a step 304, a high resistance path to ground may be produced (e.g., the neutral point 12-1 may be connected to ground through the resistor R1). In a step 306, determination may be made as to whether the detected current increases significantly (e.g., one of the test points may provide an updated current signal to the processor which may be compared with a previous current signal).

If current increase is significant, a step 308 may be performed in which localization of a fault may proceed (e.g., the processor 60 may provide location identifying information to an operator of the system 10). If a current increase is not significant, a step 310 may be performed in which a lower resistance path to ground may be produced (e.g., the neutral point 12-1 may be connected to ground through the resistor R2). Steps 306 and 310 may be cyclically repeated until either a solid path to ground is established or a significant current increase is found. In the event of finding no significant current increase in step 306 after a solid ground is produced in step 310, a step 312 is initiated in which a declaration of no-fault is made.

The method 300 may be performed continuously and repetitively so that the ungrounded electrical system may be continuously monitored to determine if a single line-ground fault may exist It should be understood, of course, that the foregoing relates to exemplary embodiments of the invention and that modifications may be made without departing from the spirit and scope of the invention as set forth in the following claims.

We claim:

1. An ungrounded electrical power distribution system comprising:
   a switching system for selectively grounding the electrical distribution system in the event of a line to ground fault;
   a plurality of conduction paths including at least a first conduction path and a second conduction path between the system and a ground potential, wherein
   the first conduction path comprises a first impedance;
   the second conduction path comprises a second impedance;
   the first impedance is higher than the second impedance;
   the switching system successively produces grounding through the first and then the second conduction paths;
   each of the plurality of the conduction paths have varying impedance; and
   the switching system comprises a pulse width modulation (PWM) system for controlling switching among the plurality of conduction paths.

2. The ungrounded electrical power distribution system of claim 1 wherein the first impedance is high enough to limit current to ground to less than five (5) amperes.

3. The ungrounded electrical power distribution system of claim 2 further comprising:
   at least one ground fault detector;
   wherein in a case of absence of the ground fault signal, the switching system takes no action.

4. The ungrounded electrical power distribution system of claim 2 wherein the switching system comprises solid-state switches.

5. The ungrounded electrical power distribution system of claim 2 further comprising:
   alternating current (AC) phase conductors; and
   direct current (DC) feeder conductors interconnected with the AC phase conductors; and
   wherein sensors are provided for each of the conductors to determine variations of line to ground voltage for the conductor.

6. A ground fault detection system for an ungrounded power distribution system comprising:
   a plurality of conduction paths between the power distribution system and ground potential;
   the conduction paths having differing impedances;
   a switching system for progressively connecting the power distribution system to ground potential through successive ones of the conduction paths having successively lower impedance;
   at least one voltage sensors for detecting variation of line voltage relative to ground potential;
   the switching system being responsive to presence of such a variation; and
   at least one current differential ground fault detector responsive to current variations produced by connecting successively lower impedance conduction paths to ground.

7. The ground fault detection system of claim 6 further comprising a zero impedance conduction path between the power distribution system and ground potential.

8. The ground fault detection system of claim 6 wherein:
   the switching system continues to successively connect conduction paths of decreasing impedance until fault current increases sufficiently to produce a fault response from the ground fault detector.

9. The ground fault detection system of claim 6 wherein the switching system comprises:
   solid state switches; and
   a PWM control unit.

10. A method of distributing electrical power on an ungrounded distribution system comprising the steps of:
    detecting a variation in line voltage to ground;
    connecting a high impedance conduction path between the distribution system and ground;
    determining whether a current change is produced or absent;
    declaring presence of line to ground fault in the presence of a current change produced by connecting the high impedance conduction path; and
    connecting a second lower impedance conduction path to ground in absence of a current change.

11. The method of claim 10 comprising the further steps of:
    connecting successive conduction paths to ground with successively lower impedance in the successive absence of current change.

12. The method of claim 11 comprising the further steps:
    connecting a zero impedance conduction path to ground; and
    declaring a non-fault in the absence of current change.

13. The method of claim 11 wherein the steps of connecting successive conduction paths are performed with PWM.

14. The method of claim 13 wherein the steps of detecting and connecting are performed continuously to monitor the system.

* * * * *